United States Patent
Wang

(10) Patent No.: US 9,618,804 B2
(45) Date of Patent: Apr. 11, 2017

(54) LIQUID CRYSTAL DISPLAY DEVICE HAVING SQUARE WAVE SHAPED DATA LINE AND ARRAY SUBSTRATE OF THE SAME

(71) Applicants: Shenzhen China Star Optoelectronics Technology Co., Ltd., Shenzhen, Guangdong (CN); Wuhan China Star Optoelectronics Technology Co., Ltd., Wuhan, Hubei (CN)

(72) Inventor: Cong Wang, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 0 days.

(21) Appl. No.: 14/765,834

(22) PCT Filed: Jul. 17, 2015

(86) PCT No.: PCT/CN2015/084312
§ 371 (c)(1),
(2) Date: Aug. 4, 2015

(87) PCT Pub. No.: WO2017/008312
PCT Pub. Date: Jan. 19, 2017

(65) Prior Publication Data
US 2017/0017125 A1    Jan. 19, 2017

(30) Foreign Application Priority Data
Jul. 13, 2015  (CN) .......................... 2015 1 0409651

(51) Int. Cl.
*H01L 29/08*    (2006.01)
*G02F 1/1343*   (2006.01)
(Continued)

(52) U.S. Cl.
CPC ...... *G02F 1/134309* (2013.01); *G02F 1/1368* (2013.01); *G02F 1/136286* (2013.01); *H01L 27/124* (2013.01); *G02F 2201/123* (2013.01)

(58) Field of Classification Search
CPC .... G02F 1/1343; G02F 1/1362; G02F 1/1368; H01L 27/12
(Continued)

(56) References Cited

U.S. PATENT DOCUMENTS

2012/0092241 A1* 4/2012 Shang ................. G09G 3/3648
345/96
2013/0113778 A1* 5/2013 Yoshimoto .......... G09G 3/3648
345/212
(Continued)

*Primary Examiner* — Caleb Henry
(74) *Attorney, Agent, or Firm* — Andrew C. Cheng

(57) ABSTRACT

The present invention provides a liquid crystal display device and an array substrate of the same. The multiple pixel electrodes located at a same column allow lights having a same color to pass through. Each data line passes around at least one column of the multiple pixel electrodes row by row, and when each data line passes around two adjacent rows of the multiple pixel electrodes, opening directions are opposite. Pixel electrodes located at odd rows are connected with a same data line, pixel electrodes located at even rows are connected with a same data line, and pixel electrodes located at odd rows and even rows are respectively connected with different data lines. The present invention can reduce a bias generated at an edge of the color resist in order to improve a light leakage phenomenon when displaying.

18 Claims, 2 Drawing Sheets

(51) Int. Cl.
*G02F 1/1368* (2006.01)
*G02F 1/1362* (2006.01)
*H01L 27/12* (2006.01)

(58) Field of Classification Search
USPC .................................... 257/72; 438/10, 34
See application file for complete search history.

(56) References Cited

U.S. PATENT DOCUMENTS

| | | | |
|---|---|---|---|
| 2014/0184967 A1* | 7/2014 | Xu | G09G 3/006 349/37 |
| 2015/0061986 A1* | 3/2015 | Song | G02F 1/134363 345/90 |
| 2015/0062510 A1* | 3/2015 | Chang | G02F 1/134336 349/110 |
| 2016/0035302 A1* | 2/2016 | Sun | G09G 3/3648 345/209 |

* cited by examiner

LIQUID CRYSTAL DISPLAY DEVICE HAVING SQUARE WAVE SHAPED DATA LINE AND ARRAY SUBSTRATE OF THE SAME

BACKGROUND OF THE INVENTION

1. Field of the Invention

The present invention relates to a display technology field, and more particular to a liquid crystal display device and an array substrate of the same.

2. Description of Related Art

A display panel is a main part of a liquid crystal display device. The main structure of the display panel includes an array substrate, a color filter substrate disposed oppositely, and a liquid crystal layer disposed between the array substrate and the color filter substrate. Wherein, the liquid crystal display device shows a color image through color resists on the color filter substrate. With reference to FIG. 1, and FIG. 1 is a pixel structure of an array substrate in the conventional art. The arrangement way is called a pen-tile way, that is, multiple gate lines G and multiple data lines D are intersected and perpendicular with each other. A pixel electrode P is located at an area defined by a gate line G and a data line D. Correspondingly, the color resists on the color filter substrate and the pixel electrodes P are correspondingly one by one.

Currently, the color resists on the color filter substrate are formed by a mask and through an exposing process. The mask is provided with an opening (equal to an area where each pixel electrode is located as shown in FIG. 1) corresponding to each color resist, and between adjacent two openings, a shielding portion is provided (equal to an area between two adjacent two pixel electrodes). In the exposing process, when a light pass through the two adjacent openings, a slit diffraction phenomenon is generated at the shielding portion such that an edge of the color resist generates a bias because of the exposing process. As a result, when the display panel is displaying, a black matrix (BM) located between two adjacent color resists cannot entirely block all of the light from the pixel electrodes of the array substrate so that a light leakage phenomenon is generated.

SUMMARY OF THE INVENTION

Accordingly, the embodiment of the present invention provides a liquid crystal display device and an array substrate of the same in order to improve the light leakage phenomenon when the liquid crystal display panel is displaying.

An embodiment of the present invention provides an array substrate, comprising: multiple gate lines; multiple data lines; and multiple pixel electrodes arranged as a matrix; wherein, in a row direction, the multiple pixel electrodes sequentially allow four colors of a white light, a green light, a red light and a blue light to pass through, and repeatedly; wherein, a width sum of adjacent two pixel electrodes along a row direction is equal to a length of each pixel electrode along a column direction; wherein, the multiple pixel electrodes located at a same column allow lights having a same color to pass through; one gate line is provided between two adjacent rows of the multiple pixel electrodes, and the multiple pixel electrodes located at a same row are connected with a same gate line; each data line passes around one column of the multiple pixel electrodes row by row; for the one column, each data line is connected with two columns of pixel electrodes which are adjacent to the one column along a column direction; when each data line passes around two adjacent rows of the multiple pixel electrodes, opening directions are opposite; for a same column of the multiple pixel electrodes, pixel electrodes located at odd rows are connected with a same data line, pixel electrodes located at even rows are connected with a same data line, and pixel electrodes located at odd rows and even rows are respectively connected with different data lines.

Wherein, the array substrate further includes multiple thin-film-transistors (TFT), and a gate electrode of each TFT is connected to an adjacent gate line, a source electrode of each TFT is connected with an adjacent data line and a drain electrode of each TFT is connected with an adjacent pixel electrode.

Another embodiment of the present invention provides an array substrate, comprising: multiple gate lines; multiple data lines; and multiple pixel electrodes arranged as a matrix; wherein, the multiple pixel electrodes located at a same column allow lights having a same color to pass through; one gate line is provided between two adjacent rows of the multiple pixel electrodes, and the multiple pixel electrodes located at a same row are connected with a same gate line; each data line passes around at least one column of the multiple pixel electrodes row by row; when each data line passes around two adjacent rows of the multiple pixel electrodes, opening directions are opposite; for a same column of the multiple pixel electrodes, pixel electrodes located at odd rows are connected with a same data line, pixel electrodes located at even rows are connected with a same data line, and pixel electrodes located at odd rows and even rows are respectively connected with different data lines.

Wherein, the multiple pixel electrodes respectively allow four colors of a red light, a green light, a blue light and a white light to pass through.

Wherein, when a data line passes around two adjacent columns of the multiple pixel electrodes, and for the two adjacent columns, the data line is sequentially connected with one pixel electrode far away from an opening direction and a pixel electrode located at a next row and adjacent to a pixel electrode which is located at the next row and is far away from an opening direction.

Wherein, in a row direction, the multiple pixel electrodes sequentially allow the red light, the green light, the blue light and the white light to pass through, and repeatedly.

Wherein, each data line passes around one column of the multiple pixel electrodes row by row, and for the one column, each data line is connected with two columns of pixel electrodes which are adjacent to the one column along a column direction.

Wherein, in a row direction, the multiple pixel electrodes sequentially allow the red light, the green light, the blue light and the white light to pass through, and repeatedly.

Wherein, a width sum of adjacent two pixel electrodes along a row direction is equal to a length of each pixel electrode along a column direction.

Wherein, the array substrate further includes multiple thin-film-transistors (TFT), and a gate electrode of each TFT is connected to an adjacent gate line, a source electrode of each TFT is connected with an adjacent data line and a drain electrode of each TFT is connected with an adjacent pixel electrode.

Another embodiment of the present invention provides a liquid crystal display device, wherein, an array substrate of the liquid crystal display device comprises: multiple gate lines; multiple data lines; and multiple pixel electrodes arranged as a matrix; wherein, the multiple pixel electrodes located at a same column allow lights having a same color to pass through; one gate line is provided between two adjacent rows of the multiple pixel electrodes, and the multiple pixel electrodes located at a same row are connected with a same gate line; each data line passes around at least one column of the multiple pixel electrodes row by row; when each data line passes around two adjacent rows of the multiple pixel electrodes, opening directions are opposite; for a same column of the multiple pixel electrodes, pixel electrodes located at odd rows are connected with a same data line, pixel electrodes located at even rows are connected with a same data line, and pixel electrodes located at odd rows and even rows are respectively connected with different data lines.

Wherein, the multiple pixel electrodes respectively allow four colors of a red light, a green light, a blue light and a white light to pass through.

Wherein, when a data line passes around two adjacent columns of the multiple pixel electrodes, and for the two adjacent columns, the data line is sequentially connected with one pixel electrode far away from an opening direction and a pixel electrode located at a next row and adjacent to a pixel electrode which is located at the next row and is far away from an opening direction.

Wherein, in a row direction, the multiple pixel electrodes sequentially allow the red light, the green light, the blue light and the white light to pass through, and repeatedly.

Wherein, each data line passes around one column of the multiple pixel electrodes row by row, and for the one column, each data line is connected with two columns of pixel electrodes which are adjacent to the one column along a column direction.

Wherein, in a row direction, the multiple pixel electrodes sequentially allow the red light, the green light, the blue light and the white light to pass through, and repeatedly.

Wherein, a width sum of adjacent two pixel electrodes along a row direction is equal to a length of each pixel electrode along a column direction.

Wherein, the array substrate further includes multiple thin-film-transistors (TFT), and a gate electrode of each TFT is connected to an adjacent gate line, a source electrode of each TFT is connected with an adjacent data line and a drain electrode of each TFT is connected with an adjacent pixel electrode.

The liquid crystal display device and the array substrate in the embodiments of the present invention, through improving the arrangement and the connection method of the data line of the array substrate, areas between two adjacent two pixel electrodes in increased without affecting the aperture ratio. Correspondingly, areas between two adjacent color resists on the color filter substrate are increased so as to reduce or eliminate the slit diffraction phenomenon generated by forming color resists by exposing process in order to reduce the bias generated at the edge of the color resist and the light leakage phenomenon.

DETAILED DESCRIPTION OF THE PREFERRED EMBODIMENT

The following content combines figures and embodiments for detail description of the present invention.

Figure 1:
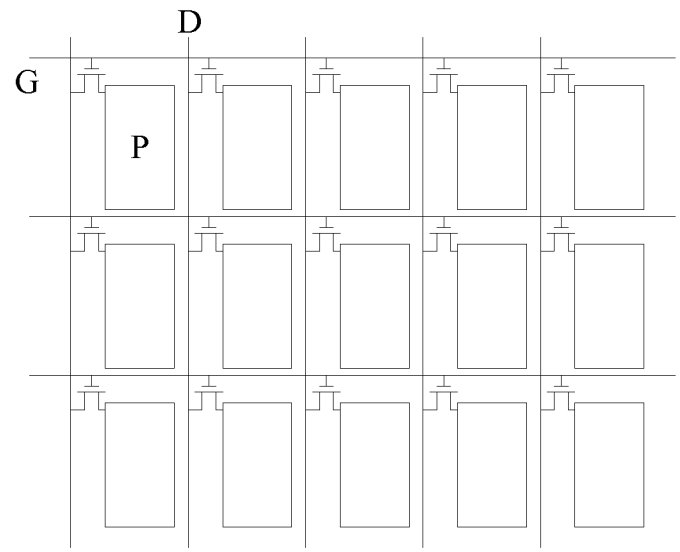
FIG. 1 is a schematic diagram of a pixel structure of an array substrate in the conventional art.
Figure 2:
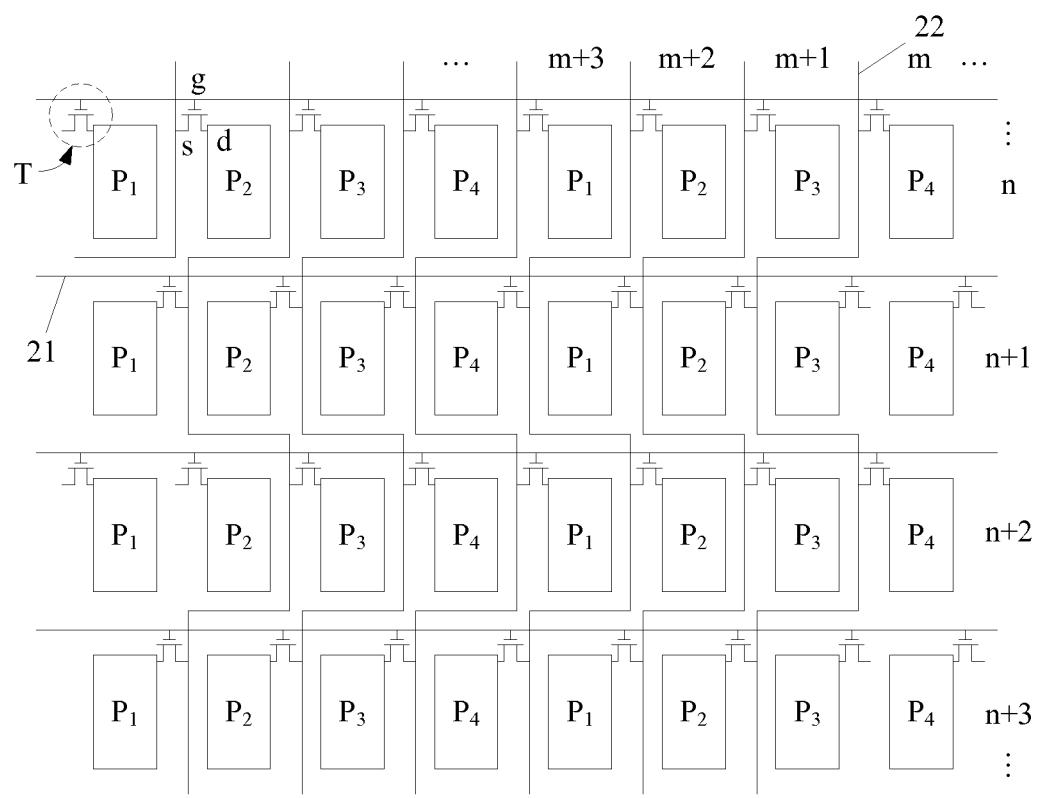
FIG. 2 is a schematic diagram of a pixel structure of an array substrate according to an embodiment of the present invention.

FIG. 2 is a schematic diagram of a pixel structure of an array substrate according to an embodiment of the present invention. As shown in FIG. 2, the array substrate includes multiple gate lines 21, multiple data lines 22 and multiple pixel electrodes P1, P2, P3 and P4 arranged as a matrix. Wherein, pixel electrodes located at a same column allow lights having a same color to pass through. For example, from right side to left side in FIG. 2, subpixels in a first column of pixel electrodes P1 function as transparent subpixels (W, White) of the array substrate for allowing a white light to pass through; subpixels in a second column of pixel electrodes P2 function as green subpixels (G, Green) of the array substrate for allowing a green light to pass through; subpixels in a third column of pixel electrodes P3 function as red subpixels (R, red) of the array substrate for allowing a red light to pass through; subpixels in a fourth column of pixel electrodes P4 function as blue subpixels (B, blue) of the array substrate for allowing a blue light to pass through. Besides, an arrangement of the subpixels is sequentially repeated along a direction in parallel with the gate line 21.

Optionally, a width sum of adjacent two pixel electrodes along a row direction is equal to a length of each pixel electrode along a column direction. That is, adjacent two pixel electrodes can form a square, and a length of the square is equal to a length of each pixel electrode.

In the present embodiment, between two adjacent row pixel electrodes, a gate line 21 is provided. Pixel electrodes in a same row are connected with a same gate line 21. Each data line 22 passes around a column of pixel electrodes sequentially row by row. A surrounding shape of each data line 22 is a bow shape, and when each data line 22 passes around each two adjacent rows of pixel electrodes, opening directions are opposite and surrounding methods are the same. For example, a first data line 22 shown at a right side of FIG. 2 passes around a (m+1)-th column of pixel electrodes P3 sequentially row by row. When the data line 22 passes around a pixel electrode P3 at a (n+1)-th row, an opening direction is toward a right side. When the data line 22 passes around a pixel electrode P3 at a (n+2)-th row, an opening direction is toward a left side. Wherein, m and n are all positive integrals.

Besides, when a data line passes around one column of pixel electrodes, the data line is connected with two columns of pixel electrodes which are adjacent to the one column passed around by the data line along a column direction. For example, a (m+1)-th column of pixel electrodes P3 is respectively adjacent to an m-th column of pixel electrodes P4 and a (m+2)-th column of pixel electrodes P2. The first data line 22 at right side shown in FIG. 2 which passes around the (m+1)-th column of pixel electrodes P3 is connected with a n-th row and m-th column pixel electrode P4, a (n+1)-th row and (m+2)-th column pixel electrode P2, a (n+2)-th row and m-th column pixel electrode P4, and a (n+3)-th row and (m+2)-th column pixel electrode P2 along a column direction and continuously connected, and so on.

Figure 3:
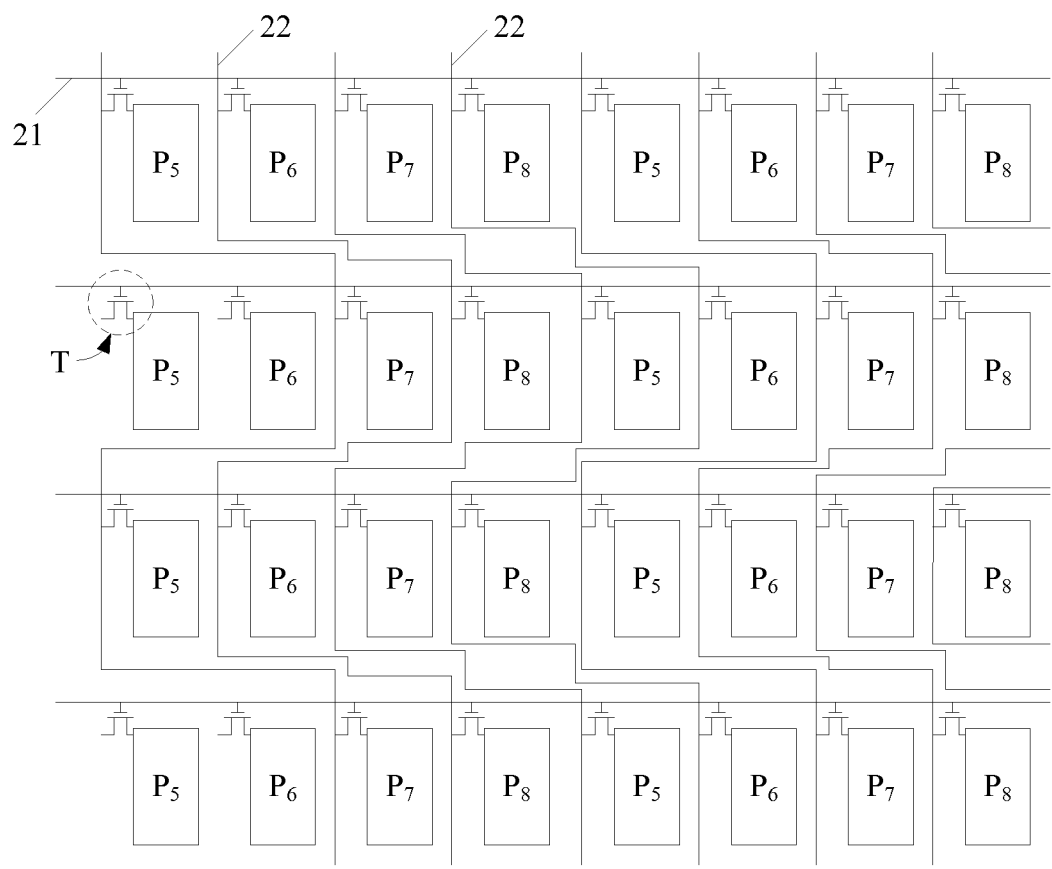
FIG. 3 is a schematic diagram of a pixel structure of an array substrate according to another embodiment of the present invention.

It can be understand that the arrangement way of the bow-shape data line 22 is just an embodiment of the present invention. In a practical application, an arrangement shape of each data line 22 and a surrounding method for each column of pixel electrodes may not be the same. That is, the arrangement shape may be irregular, for example:

With reference to FIG. 3, and FIG. 3 is a pixel structure according to another embodiment of the array substrate of the present invention. From left side to right side, subpixels in a first column of pixel electrodes P5 function as red subpixels of the array substrate for allowing a red light to pass through. Subpixels in a second column of pixel electrodes P6 function as green subpixels of the array substrate for allowing a green light to pass through. Subpixels in a third column of pixel electrodes P7 function as blue subpixels of the array substrate for allowing a blue light to pass through. Subpixels in a fourth column of pixel electrodes P8 function as white subpixels of the array substrate for allowing white light to pass through. Besides, the subpixels are arranged along a direction in parallel with a gate line 21, and are sequentially repeated.

In an embodiment shown in FIG. 3, each data line 22 passes around two adjacent columns of pixel electrodes row by row. When a data line 22 passes around two adjacent columns of pixel electrodes, the data line 22 is sequentially connected with one pixel electrode far away from an opening direction and a pixel electrode located at a next row and adjacent to a pixel electrode which is located at the next row and is far away from an opening direction. The above connection is along a column direction and is connected sequentially. For example, as shown in FIG. 3, from left side to right side, a first data line 22 passes around a first column of pixel electrodes P5 and a second column of pixel electrodes P6 row by row. When the data line 22 passes around a first row of pixel electrodes P5 and P6, an opening direction is toward a right side. When the data line 22 passes around a second row of pixel electrodes P5 and P6, an opening direction is toward a left side. Wherein, a first row and first column pixel electrode P5 is far away from the opening direction toward the right side, and the data line 22 is connected with the first row and first column pixel electrode P5. A second row and second column pixel electrode P6 is far away from the opening direction toward the left side. A pixel electrode P7 adjacent to the pixel electrode P6 is a second row and third column pixel electrode P7, and the data line 22 is connected with the second row and third column pixel electrode P7. A third row and first column pixel electrode P5 is far away from an opening direction toward a right side, and the data line 22 is connected with the third row and first column pixel electrode P5. A fourth row and second column pixel electrode P6 is far away from an opening direction toward a left side. A pixel electrode adjacent to the pixel electrode P6 is a fourth row and third column pixel electrode P7, and the data line 22 is connected with the fourth row and third column pixel electrode P7. The above connection is along a column direction and is connected sequentially.

No matter what kind of arrangement shape is adopted, the embodiment of the present invention must satisfy conditions of: each data line 22 passes around at least one adjacent column of pixel electrodes row by row, and when each data line 22 passes around two adjacent rows of the multiple pixel electrodes, opening directions are opposite such that for a same column of the multiple pixel electrodes, pixel electrodes located at odd rows are connected with a same data line 22, pixel electrodes located at even rows are connected with a same data line 22, and pixel electrodes located at odd rows and even rows are respectively connected with different data lines 22. For example, as shown in FIG. 3, in the fourth column, pixel electrodes P8 of a first row and a third row are connected with a fourth data line 22, and pixel electrodes P8 of a second row and a fourth row are connected with a second data line 22.

In the above embodiments, each pixel electrode is connected with adjacent data line at a column direction, and the above embodiments are specifically realized m*n thin-film-transistors (TFT) T on the array substrate. Wherein, a gate electrode g of each TFT T is connected to an adjacent gate line 21, a source electrode s of each TFT T is connected with an adjacent data line 22 and a drain electrode d of each TFT T is connected with an adjacent pixel electrode.

Accordingly, in the embodiments of the present invention, through improving the arrangement and the connection method of the data line 22 of the array substrate, areas between two adjacent two pixel electrodes in the conventional art do not require to be changed. That is, without affecting the aperture ratio, a trace area between two adjacent rows of pixel electrodes is increased. Correspondingly, areas between two adjacent color resists on the color filter substrate are increased so as to reduce or eliminate the slit diffraction phenomenon generated by forming color resists by exposing through the mask in order to reduce the bias generated at the edge of the color resist. When displaying, a black matrix locate between adjacent two color resists on the color filter substrate can maximally block or block all lights from the pixel electrodes of the array substrate so as to improve or eliminate the light leakage phenomenon.

The resent invention also provides a liquid crystal display device such as a liquid crystal display panel or a liquid crystal display device, which includes an array substrate having above pixel structure.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. An array substrate, comprising:
   multiple gate lines;
   multiple data lines; and
   multiple pixel electrodes arranged as a matrix;
   wherein, in a row direction, the multiple pixel electrodes sequentially allow four colors of a white light, a green light, a red light and a blue light to pass through, and repeatedly;
   wherein, a width sum of adjacent two pixel electrodes along a row direction is equal to a length of each pixel electrode along a column direction; and
   wherein, the multiple pixel electrodes located at a same column allow lights having a same color to pass through; one gate line is provided between two adjacent rows of the multiple pixel electrodes, and the multiple pixel electrodes located at a same row are connected with a same gate line; each data line passes around one column of the multiple pixel electrodes row by row in a meandering way, and a pattern of each data line is square wave shaped; for the one column, each data line is connected with two columns of pixel electrodes which are adjacent to the one column along a column direction; at two adjacent rows of the multiple pixel electrodes, opening directions which are formed by each data line at the two adjacent rows are opposite; for a same column of the multiple pixel electrodes, pixel electrodes located at odd rows are connected with a same data line, pixel electrodes located at even rows are connected with a same data line, and pixel electrodes located at odd rows and even rows are respectively connected with different data lines.

2. The array substrate according to claim 1, wherein, the array substrate further includes multiple thin-film-transistors (TFT), and a gate electrode of each TFT is connected to an adjacent gate line, a source electrode of each TFT is connected with an adjacent data line and a drain electrode of each TFT is connected with an adjacent pixel electrode.

3. An array substrate, comprising:
multiple gate lines;
multiple data lines; and
multiple pixel electrodes arranged as a matrix;
wherein, the multiple pixel electrodes located at a same column allow lights having a same color to pass through; one gate line is provided between two adjacent rows of the multiple pixel electrodes, and the multiple pixel electrodes located at a same row are connected with a same gate line; each data line passes around at least one column of the multiple pixel electrodes row by row in a meandering way, and a pattern of each data line is square wave shaped; at two adjacent rows of the multiple pixel electrodes, opening directions which are formed by each data line at the two adjacent rows are opposite; for a same column of the multiple pixel electrodes, pixel electrodes located at odd rows are connected with a same data line, pixel electrodes located at even rows are connected with a same data line, and pixel electrodes located at odd rows and even rows are respectively connected with different data lines.

4. The array substrate according to claim 3, wherein, the multiple pixel electrodes respectively allow four colors of a red light, a green light, a blue light and a white light to pass through.

5. The array substrate according to claim 4, wherein, when a data line passes around two adjacent columns of the multiple pixel electrodes, and for the two adjacent columns, the data line is sequentially connected with one pixel electrode far away from an opening direction and a pixel electrode located at a next row and adjacent to a pixel electrode which is located at the next row and is far away from an opening direction.

6. The array substrate according to claim 5, wherein, in a row direction, the multiple pixel electrodes sequentially allow the red light, the green light, the blue light and the white light to pass through, and repeatedly.

7. The array substrate according to claim 4, wherein, each data line passes around one column of the multiple pixel electrodes row by row, and for the one column, each data line is connected with two columns of pixel electrodes which are adjacent to the one column along a column direction.

8. The array substrate according to claim 7, wherein, in a row direction, the multiple pixel electrodes sequentially allow the red light, the green light, the blue light and the white light to pass through, and repeatedly.

9. The array substrate according to claim 3, wherein, a width sum of adjacent two pixel electrodes along a row direction is equal to a length of each pixel electrode along a column direction.

10. The array substrate according to claim 3, wherein, the array substrate further includes multiple thin-film-transistors (TFT), and a gate electrode of each TFT is connected to an adjacent gate line, a source electrode of each TFT is connected with an adjacent data line and a drain electrode of each TFT is connected with an adjacent pixel electrode.

11. A liquid crystal display device, wherein, an array substrate of the liquid crystal display device comprises:
multiple gate lines;
multiple data lines; and
multiple pixel electrodes arranged as a matrix;
wherein, the multiple pixel electrodes located at a same column allow lights having a same color to pass through; one gate line is provided between two adjacent rows of the multiple pixel electrodes, and the multiple pixel electrodes located at a same row are connected with a same gate line; each data line passes around at least one column of the multiple pixel electrodes row by row in a meandering way, and a pattern of each data line is square wave shaped; at two adjacent rows of the multiple pixel electrodes, opening directions which are formed by each data line at the two adjacent rows are opposite; for a same column of the multiple pixel electrodes, pixel electrodes located at odd rows are connected with a same data line, pixel electrodes located at even rows are connected with a same data line, and pixel electrodes located at odd rows and even rows are respectively connected with different data lines.

12. The liquid crystal display device according to claim 11, wherein, the multiple pixel electrodes respectively allow four colors of a red light, a green light, a blue light and a white light to pass through.

13. The liquid crystal display device according to claim 12, wherein, when a data line passes around two adjacent columns of the multiple pixel electrodes, and for the two adjacent columns, the data line is sequentially connected with one pixel electrode far away from an opening direction and a pixel electrode located at a next row and adjacent to a pixel electrode which is located at the next row and is far away from an opening direction.

14. The liquid crystal display device according to claim 13, wherein, in a row direction, the multiple pixel electrodes sequentially allow the red light, the green light, the blue light and the white light to pass through, and repeatedly.

15. The liquid crystal display device according to claim 12, wherein, each data line passes around one column of the multiple pixel electrodes row by row, and for the one column, each data line is connected with two columns of pixel electrodes which are adjacent to the one column along a column direction.

16. The liquid crystal display device according to claim 15, wherein, in a row direction, the multiple pixel electrodes sequentially allow the red light, the green light, the blue light and the white light to pass through, and repeatedly.

17. The liquid crystal display device according to claim 11, wherein, a width sum of adjacent two pixel electrodes along a row direction is equal to a length of each pixel electrode along a column direction.

18. The liquid crystal display device according to claim 11, wherein, the array substrate further includes multiple thin-film-transistors (TFT), and a gate electrode of each TFT is connected to an adjacent gate line, a source electrode of each TFT is connected with an adjacent data line and a drain electrode of each TFT is connected with an adjacent pixel electrode.

* * * * *